United States Patent [19]
Yamauchi

[11] Patent Number: 5,701,296
[45] Date of Patent: Dec. 23, 1997

[54] RELIABLE BURST SIGNAL DETECTING APPARATUS

[75] Inventor: Hideyuki Yamauchi, Fukushima, Japan

[73] Assignee: NEC Corporation, Tokyo, Japan

[21] Appl. No.: 599,353

[22] Filed: Feb. 9, 1996

[30] Foreign Application Priority Data

Feb. 10, 1995 [JP] Japan .................................. 7-023063

[51] Int. Cl.$^6$ ................................................ H03K 5/1534
[52] U.S. Cl. ............................ 370/282; 375/342; 375/360
[58] Field of Search ...................................... 370/276, 277, 370/278, 280, 282, 294, 350, 520, 503, 504; 375/340, 342, 357, 360, 364, 369, 370; 348/505, 506

[56] References Cited

U.S. PATENT DOCUMENTS

| | | | |
|---|---|---|---|
| Re. 35,078 | 10/1995 | Ryan | 380/11 |
| 4,397,042 | 8/1983 | Tsuji | 375/360 |
| 4,507,795 | 3/1985 | Wagner | 375/342 |

FOREIGN PATENT DOCUMENTS 57-116461  7/1982  Japan .

Primary Examiner—Douglas W. Olms
Assistant Examiner—Matthew Phillips
Attorney, Agent, or Firm—Sughrue, Mion, Zinn, Macpeak & Seas, PLLC

[57] ABSTRACT

In a burst signal detecting apparatus, a first circuit is provided to detect a falling edge in a burst signal to generate a first pulse signal when a low level of the burst signal continues for a time period after the falling edge is detected in the burst signal. Also, a second circuit is provided to detect a rising edge in a burst signal to generate a second pulse signal when a high level of the burst signal continues for the time period after the rising edge is detected in the burst signal. The first pulse signal is logically combined with the second pulse signal to generate a burst signal detection signal. Each of the time periods is smaller than a minimum time period of one bit of the burst signal. The pulse width of each of the first and second pulse signals is longer than a time period of a predetermined number of bits of the burst signal.

23 Claims, 9 Drawing Sheets

Fig. 14
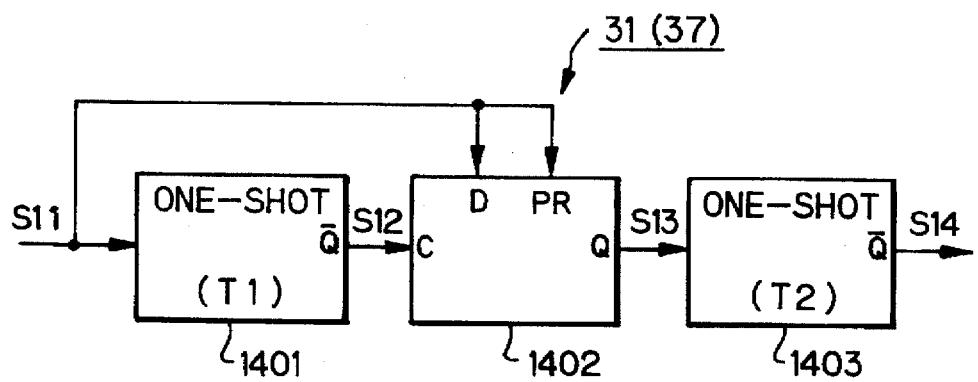
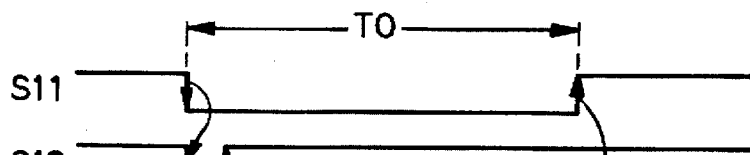
Fig. 15A S11
Fig. 15B S12
Fig. 15C S13
Fig. 15D S14
Fig. 16A S11
Fig. 16B S12
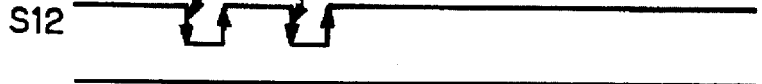
Fig. 16C S13
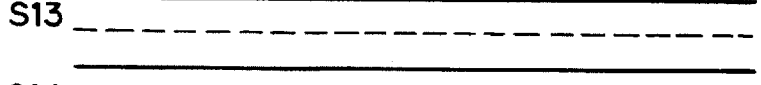
Fig. 16D S14

Fig. 17
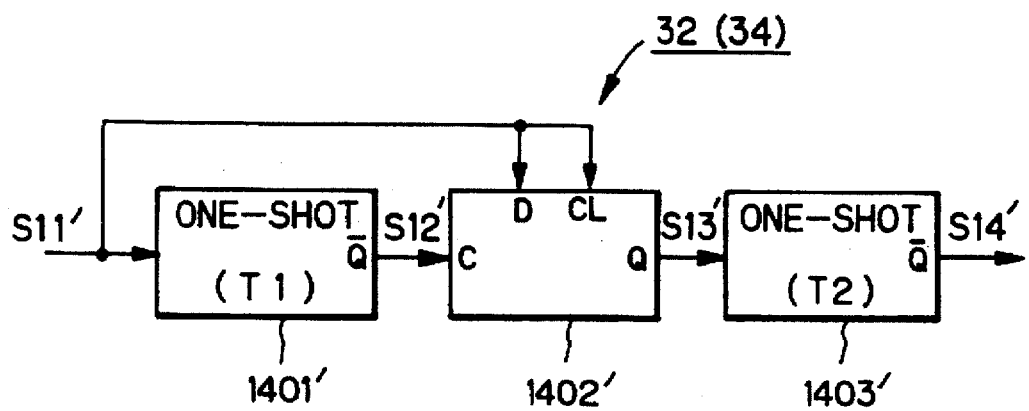
Fig. 18A S11'
Fig. 18B S12'
Fig. 18C S13'
Fig. 18D S14'
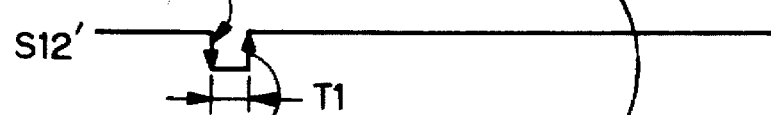
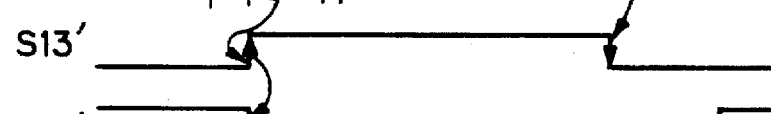
Fig. 19A S11'
Fig. 19B S12'
Fig. 19C S13'
Fig. 19D S14'
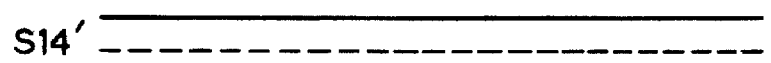

RELIABLE BURST SIGNAL DETECTING APPARATUS

BACKGROUND OF THE INVENTION

1. Field of the Invention

The present invention relates to a burst signal detecting apparatus used in switching of transmission and reception in bidirectional communication.

2. Description of the Related Art

In a bidirectional communication system, when a burst signal is detected in an output of a transmitter circuit in an apparatus, the apparatus is switched from a receiving mode to a transmitting mode. Therefore, in order to detect a burst signal, a burst signal detecting circuit is provided.

In a prior art burst signal detecting circuit, a monostable multivibrator (or one-shot multivibrator) is triggered by a rising edge or a falling edge of a burst signal to generate a pulse signal having a time period longer than a fixed-length duration time period. Then, the pulse signal is logically combined with a delayed signal thereof, to generate a burst signal detection signal depending on the fixed-length duration time period (see JP-A-57-116461).

In the above-described prior art burst signal detecting circuit, however, since the one-shot multivibrator is operated in response to noise such as click and surging noise, the apparatus is easily switched erroneously from a receiving mode to a transmitting mode. Also, once the apparatus is erroneously switched from a receiving mode to a transmitting mode, the apparatus cannot recover the receiving state for the fixed-length duration time period. Further, since the burst signal detection signal has a fixed-length duration, the above-described prior art burst signal detecting circuit cannot be applied to burst signals having random-length duration.

SUMMARY OF THE INVENTION

It is an object of the present invention to provide a reliable burst signal detecting apparatus which is not subject to noise.

Another object is to be able to recover a receiving state even after the burst signal detecting apparatus is erroneously operated.

A further object is to be able to apply the burst signal detecting apparatus to random-length burst signals.

According to the present invention, in a burst signal detecting apparatus, a first circuit is provided to detect a falling edge in a burst signal to generate a first pulse signal when a low level of the burst signal continues for a first time period after the falling edge is detected in the burst signal. Also, a second circuit is provided to detect a rising edge in a burst signal to generate a second pulse signal when a high level of the burst signal continues for a second time period after the rising edge is detected in the burst signal. The first pulse signal is logically combined with the second pulse signal to generate a burst signal detection signal. Each of the first and second time periods is smaller than a minimum time period of one bit of the burst signal. Each of the pulse widthes of the first and second pulse signals is longer than a time period of a predetermined number of bits of the burst signal.

Since a protection time such as the first and second time periods is provided for detecting a falling edge or a rising edge in the burst signal, the apparatus is hardly operated in response to noise. Also, since the apparatus is operated in response to every bit of the burst signal, the apparatus can rapidly recover its receiving state even after the apparatus is erroneously operated. Further, since the burst signal detection signal depends upon each bit of the detected burst signal, the apparatus can be applied to random length burst signals.

BRIEF DESCRIPTION OF THE DRAWINGS

The present invention will be more clearly understood from the description as set forth below, in comparison with the prior art, with reference to the accompanying drawings, wherein:

FIG. 14 is a detailed block circuit diagram of the falling edge detecting circuit of FIGS. 3, 5, 7, 9, 11 and 13;

FIGS. 15A through 15D are timing diagrams for explaining the operation of the circuit of FIG. 14;

FIGS. 16A through 16D are timing diagrams for explaining the operation of the circuit of FIG. 14;

FIG. 17 is a detailed block circuit diagram of the rising edge detecting circuit of FIGS. 3, 4, 7, 8, 11 and 12;

FIGS. 18A through 18D are timing diagrams for explaining the operation of the circuit of FIG. 17; and FIGS. 19A through 19D are timing diagrams for explaining the operation of the circuit of FIG. 17.

DESCRIPTION OF THE PREFERRED EMBODIMENTS

Figure 1:
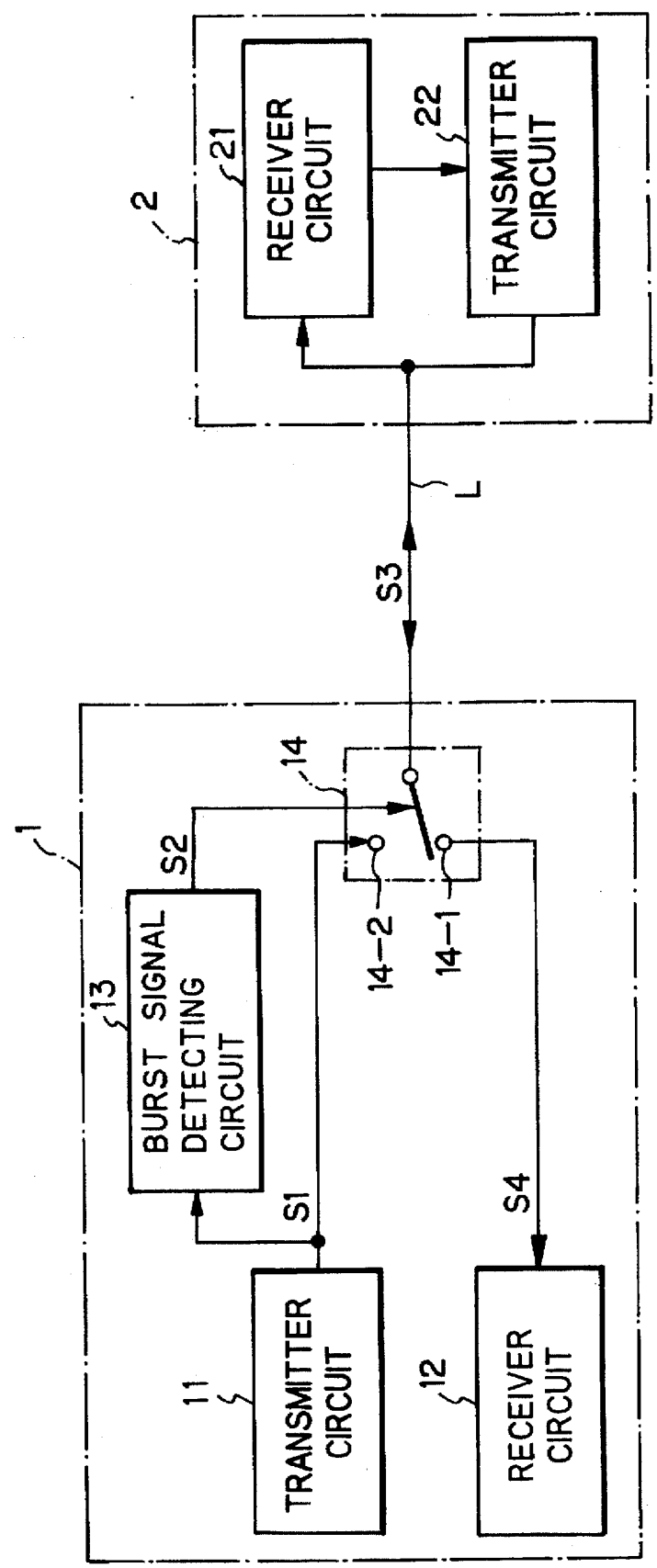
FIG. 1. is a block circuit diagram illustrating a bidirectional communication system to which embodiments of the burst signal detecting apparatus according to the present are applied.

In FIG. 1, which illustrates a bidirectional communication system to which embodiments of the present invention are applied, a unit 1 is connected via a bidirectional transmission line L to a unit 2. Here, assume that switching of a transmitting mode and a receiving mode is carried out in the unit 1. The unit 1 includes a transmitter circuit 11, a receiver circuit 12, a burst signal detecting circuit 13, and a switch 14. On the other hand, the unit 2 includes a receiver circuit 21 and a transmitter circuit 22. In a standby mode, i.e., in a receiving mode, the switch 14 is located on a lower side 14-1. Therefore, the transmitter circuit 22 of the unit 2 is connected via the bidirectional transmission line L to the receiver circuit 12 of the unit 1. In this receiving mode, when the burst signal detecting circuit 13 detects a burst signal in the output signal of the transmitter circuit 11, the burst signal detecting circuit 13 controls the switch 14 so that the switch 14 is located on an upper side 14-2. Therefore, the transmitter circuit 11 of the unit 1 is connected via the bidirectional transmission line L to the unit 2. In this case, note that the receiver circuit 21 stops the operation of the transmitter circuit 22. Thus, switching from a receiving mode to a transmitting mode is completed.

The operation of the system of FIG. 1 is explained next with reference to FIGS. 2A through 2D.

Figure 2:
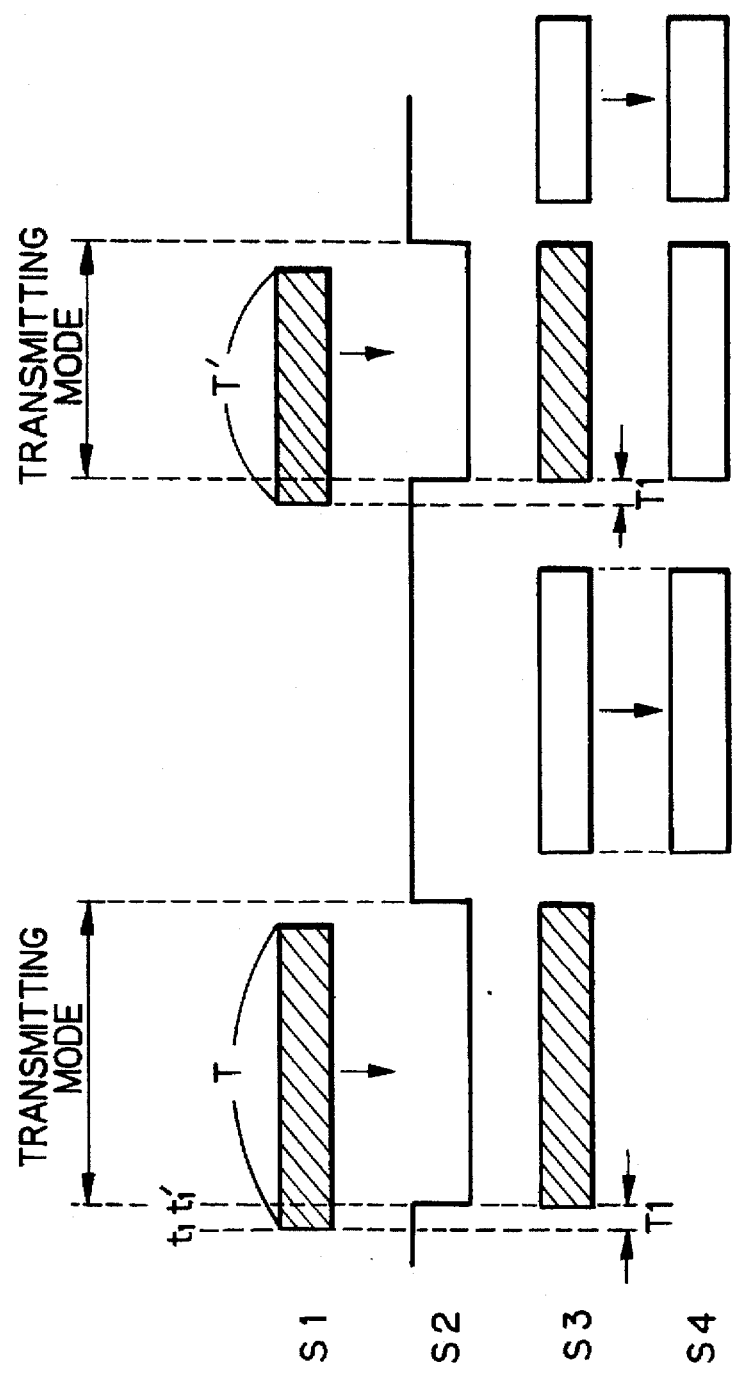
FIGS. 2A through 2D are timing diagrams for explaining the operation of the system of FIG. 1.

As shown in FIG. 2A, at time $t_1$ or $t_2$, the transmitter circuit 11 generates a signal S1 including a burst signal. As a result, at time $t_1'$ or $t_2'$ after a protection time period T1 has passed, the burst signal detecting circuit 13 generates a burst signal detection signal S2 as shown in FIG. 2B. As a result, the signal S1 is transmitted as a signal S3 as shown in FIG. 2C via the bidirectional transmission line L to the receiver circuit 21. This transmitting mode continues for a burst duration T or T' depending upon the burst signal detection signal S2. After the transmitting mode is completed, the system recovers a standby state, so that a receiving operation from the transmitter circuit 22 to the receiver circuit 12 is carried out as shown in FIGS. 2C and 2D.

Note that the burst duration T or T' is variable, and the system of FIG. 1 can be applied to random-length burst signals.

Figure 3:
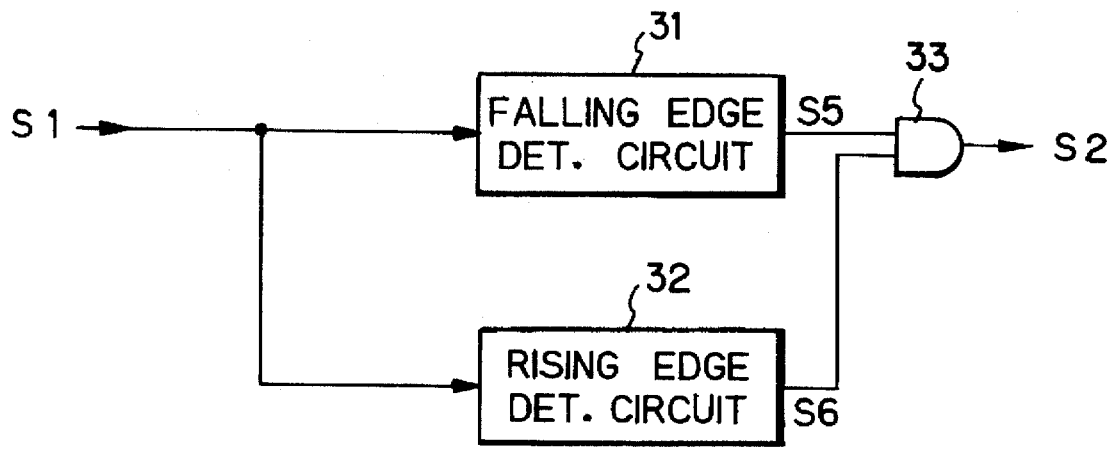
FIG. 3 is a block circuit diagram illustrating a first embodiment of the burst signal detecting apparatus according to the present invention.

In FIG. 3, which illustrates a first embodiment of the burst signal detecting apparatus according to the present invention, the burst signal detecting apparatus serves as the burst signal detecting circuit 13 of FIG. 1. The burst signal detecting apparatus includes a falling edge detecting circuit 31 for detecting a falling edge in the output signal S1 of the transmitter circuit 11, a rising edge detecting circuit 32 for detecting a rising edge in the output signal S1 of the transmitter circuit 11, and an AND circuit 33. In this case, only when the time period T1 has passed after a falling edge is detected in the output signal S1 of the transmitter circuit 11, does the falling edge detecting circuit 31 generate a pulse signal S5. Similarly, only when the time period T1 has passed after a rising edge is detected in the output signal S1 of the transmitter circuit 11, does the rising edge detecting circuit 32 generate a pulse signal S6. The AND circuit 33 logically adds the pulse signal S5 of the falling edge detecting circuit 31 to the pulse signal S6 of the rising edge detecting circuit 32, to generate the burst signal detection signal S2.

Figure 4:
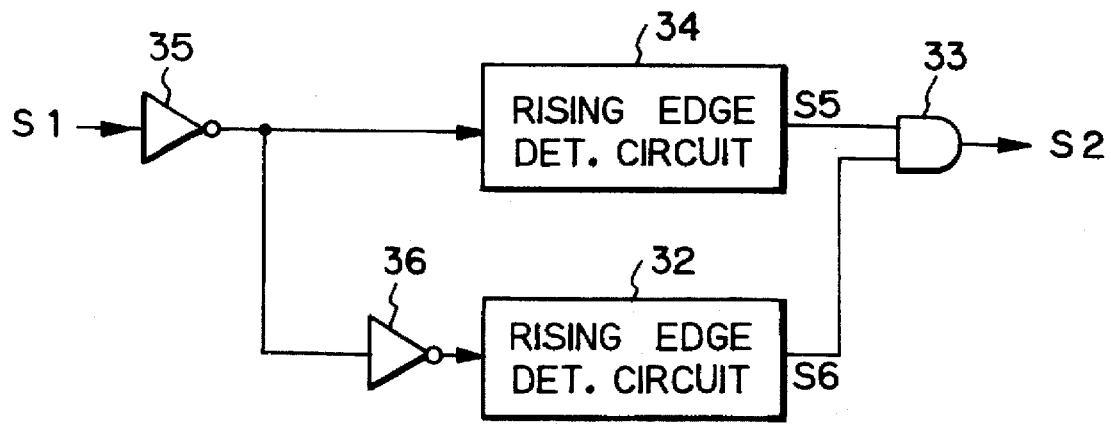
FIG. 4 is a block circuit diagram illustrating a second embodiment of the burst signal detecting apparatus according to the present invention.

In FIG. 4, which illustrates a second embodiment of the present invention, a rising edge detecting circuit 34 and inverters 35 and 36 are provided instead of the falling edge detecting circuit 31 of FIG. 3. In this case, the rising edge detecting circuit 34 and the inverter 35 serve as the falling edge detecting circuit 31 of FIG. 3, and therefore, the operation of the apparatus of FIG. 4 is similar to that of the apparatus of FIG. 3.

Figure 5:
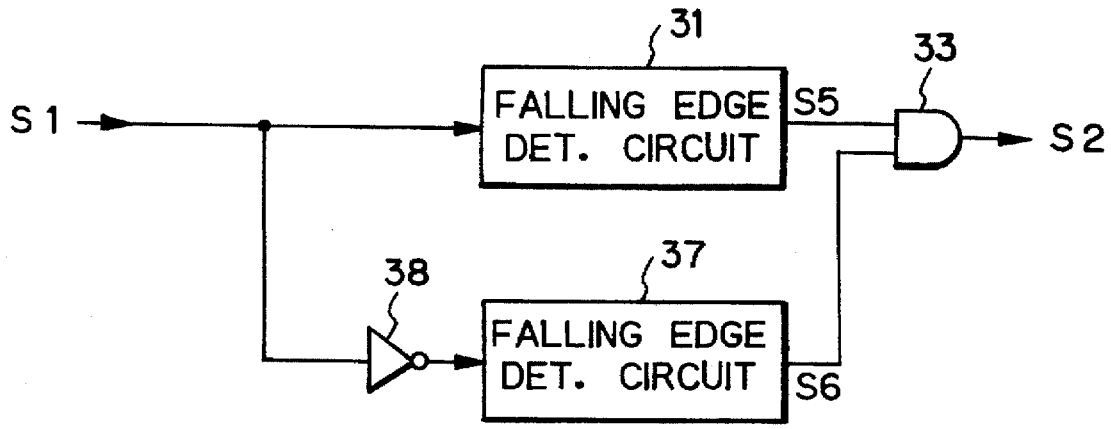
FIG. 5 is a block circuit diagram illustrating a third embodiment of the burst signal detecting apparatus according to the present invention.

In FIG. 5, which illustrates a third embodiment of the present invention, a falling edge detecting circuit 37 and an inverter 38 are provided instead of the rising edge detecting circuit 32 of FIG. 3. In this case, the falling edge detecting circuit 37 and the inverter 38 serve as the rising edge detecting circuit 32 of FIG. 3, and therefore, the operation of the apparatus of FIG. 5 is also similar to that of the apparatus of FIG. 3.

The operation of the apparatus of FIG. 3 is explained next with reference to FIGS. 6A through 6E.

Figure 6:
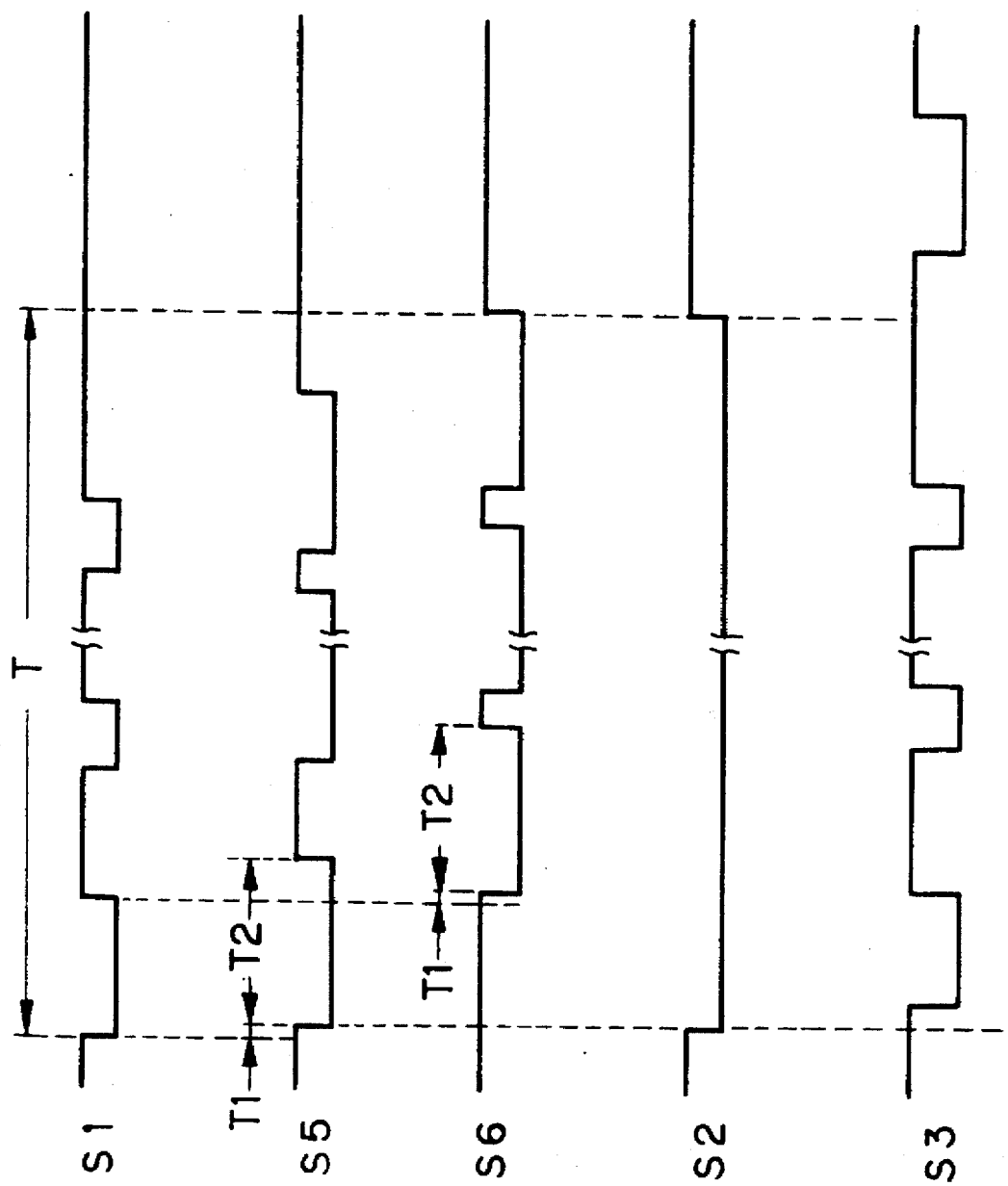
FIGS. 6A through 6E are timing diagrams for explaining the operation of the apparatus of FIG. 4.

As shown in FIG. 6A, the output signal S1 of the transmitter circuit 11 of FIG. 1 is changed. As a result, the falling edge detecting circuit 31 detects a falling edge in the output signal S1. In this case, only when a low level of the output signal S1 continues for the time period T1, does the falling edge detecting circuit 31 generate the pulse signal S5 having a pulse width T2, as shown in FIG. 6B. Also, the rising edge detecting circuit 32 detects a rising edge in the output signal S1. In this case, only when a high level of the output signal S1 continues for the time period T1, does the rising edge detecting circuit 32 generate the pulse signal S6 having a pulse width T2, as shown in FIG. 6C. Then, the pulse signal S5 of FIG. 6B is logically added by the AND circuit 33 to the pulse signal S6 of FIG. 6C, so that a burst signal detection signal S2 as shown in FIG. 6D is obtained. Therefore, the switch 14 of FIG. 1 is located on the upper side 14-2, and as a result, the signal of the bidirectional transmission line L is changed as shown in FIG. 6E. Thus, a transmitting mode is established during the time period T.

Figure 7:
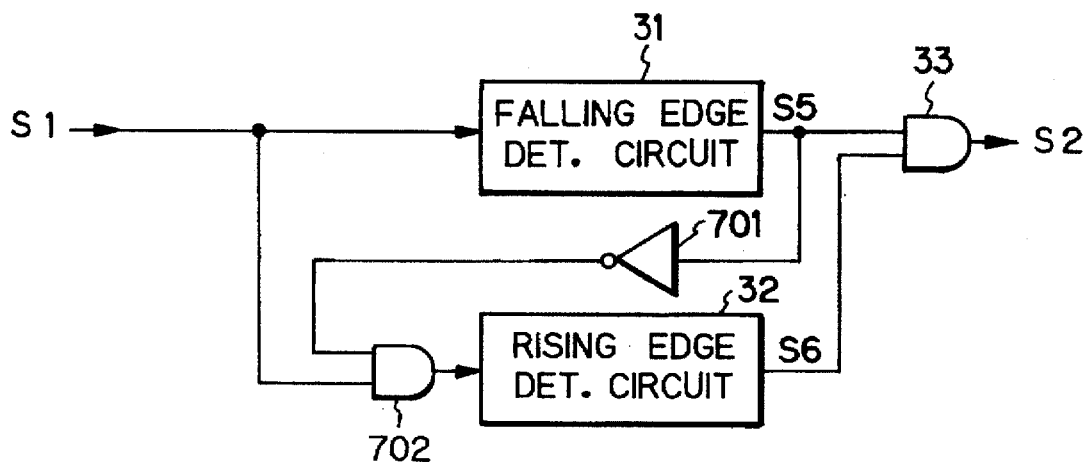
FIGS. 7, 8 and 9 are block circuit diagrams illustrating modifications of the apparatuses of FIGS. 3, 4 and 5, respectively.
Figure 8:
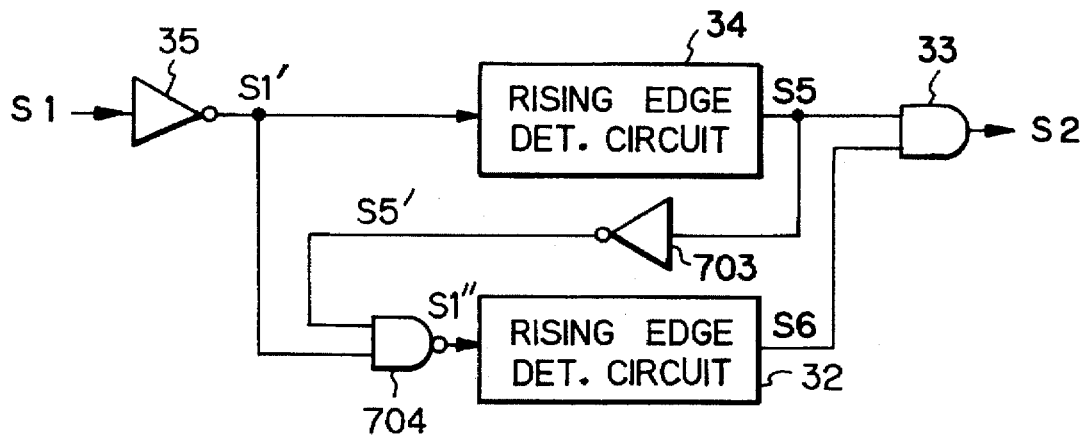
Figure 9:
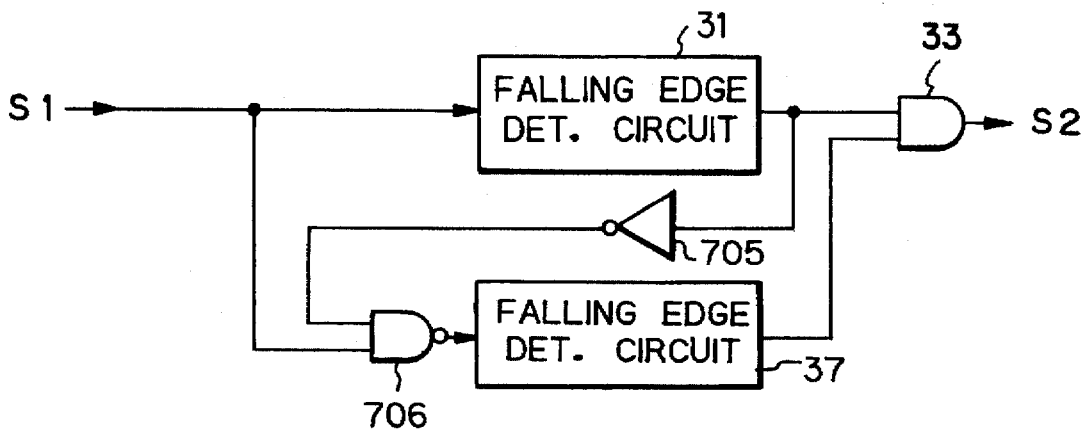

In FIG. 7, an inverter 701 and an AND circuit 702 are added to the elements of FIG. 3. In FIG. 8, an inverter 703 is added to the elements of FIG. 4, and a NAND circuit 704 is provided instead of the inverter 36 of FIG. 4. In FIG. 9, an inverter 705 is added to the elements of. FIG. 5, and a NAND circuit 706 is provided instead of the inverter 38 of FIG. 5. In FIGS. 7, 8 and 9, after a falling edge is detected in the signal S1, a rising edge is detected in the signal S1. In more detail, in FIG. 7, when the falling edge detecting circuit 31 generates a low level pulse signal S5, the rising edge detecting circuit 32 can operate in response to the signal S1. In FIG. 8, when the rising edge detecting circuit 34 generates a low level pulse signal S5, the rising edge detecting circuit 32 can operate in response to the signal S1. In FIG. 9, when the falling edge detecting circuit 31 generates a low level pulse signal S5, the falling edge detecting circuit 37 can operate in response to the signal S1.

The operations of the apparatuses of FIGS. 7, 8 and 9 are similar to each other.

The operation of the apparatus of FIG. 8 is explained next with reference to FIGS. 10A through 10H.

Figure 10:
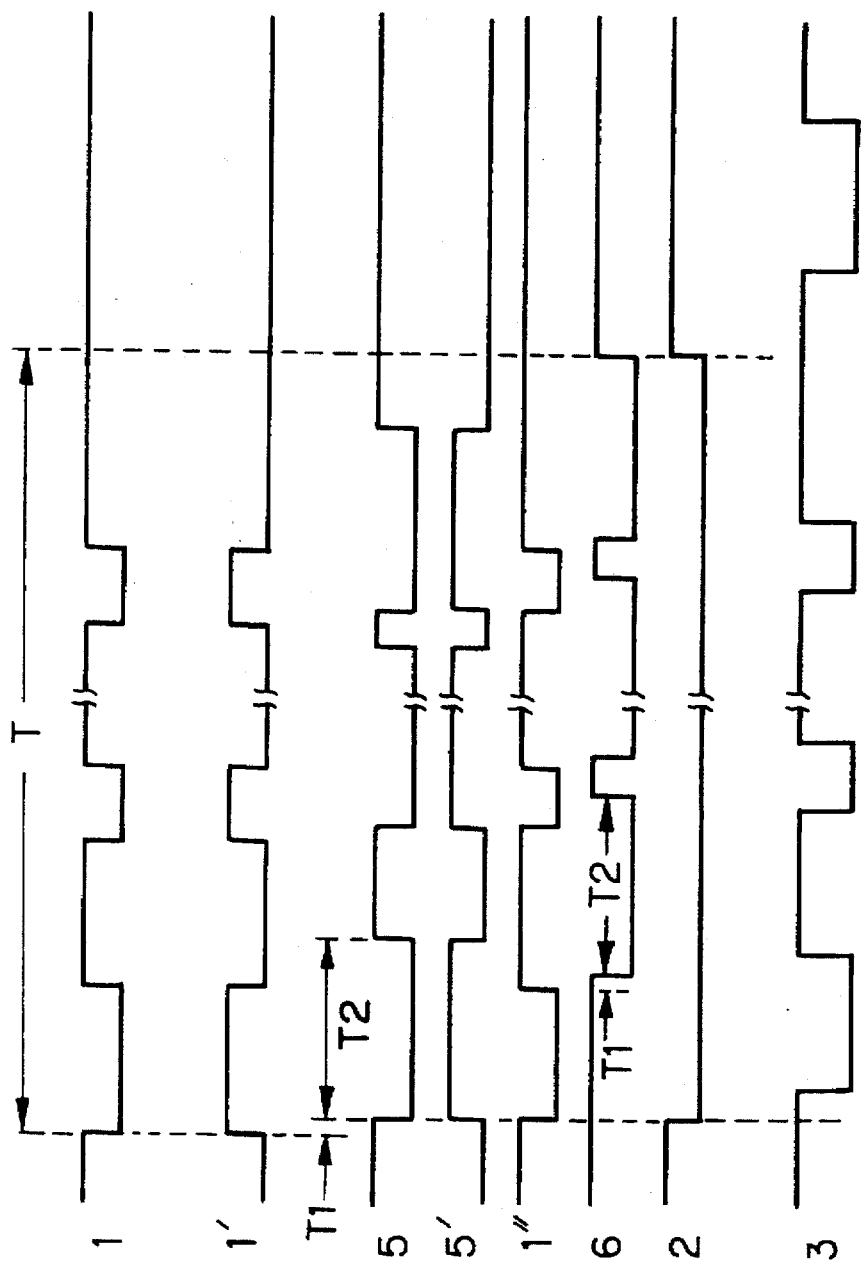
FIGS. 10A through 10H are timing diagrams for explaining the operation of the apparatus of FIG. 8.

As shown in FIG. 10A, the output signal S1 of the transmitter circuit 11 of FIG. 1 is changed, and accordingly, as shown in FIG. 10B, the output signal S1' of the inverter 35 is changed. As a result, the rising edge detecting circuit 34 detects a rising edge in the signal S1'. In this case, only when a high level of the output signal S1' continues for the time period T1, does the rising edge detecting circuit 34 generate the pulse signal S5 having a pulse width T2, as shown in FIG. 10C. Also, the pulse signal S5 is inverted by the inverter 703 to generate a signal S5' as shown in FIG. 10D. Therefore, when the signal S5' is high, the output signal S1' of the inverter 35 passes through the NAND circuit 704 to generate a signal S1" as shown in FIG. 10E. As a result, the rising edge detecting circuit 32 detects a rising edge in the signal S1". In this case, only when a high level of the signal S1" continues for the time period T1, does the rising edge detecting circuit 32 generate the pulse signal S6 having a pulse width T2, as shown in FIG. 10F. Then, the pulse signal S5 of FIG. 10C is logically added by the AND circuit 33 to the pulse signal S6 of FIG. 10F, so that a burst signal detection signal S2 as shown in FIG. 10G is obtained. Therefore, the switch 14 of FIG. 1 is located on the upper side 14-2, and as a result, the signal of the bidirectional transmission line L is changed as shown in FIG. 10H. Thus, a transmitting mode is established during the time period T.

Figure 11:
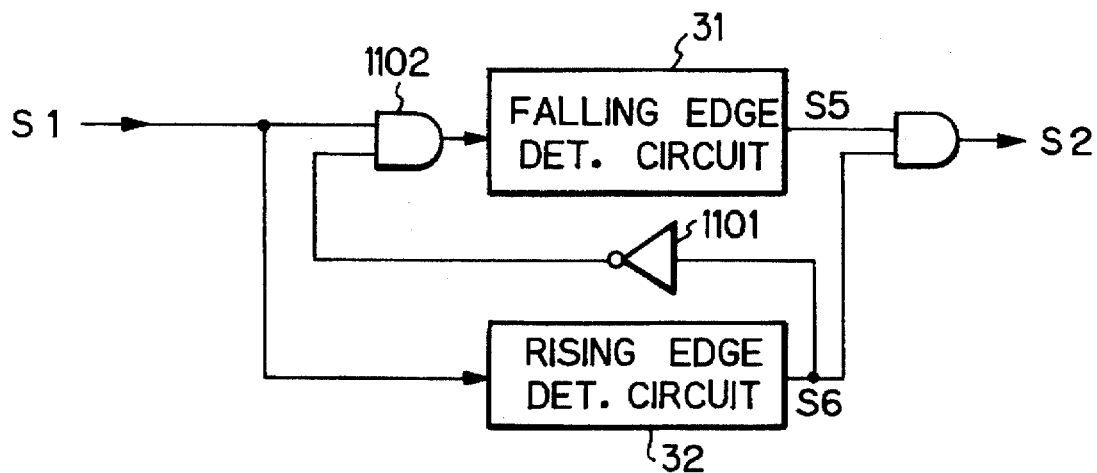
FIGS. 11, 12 and 13 are block circuit diagrams illustrating modifications of the apparatuses of FIGS. 3, 4 and 5, respectively.
Figure 12:
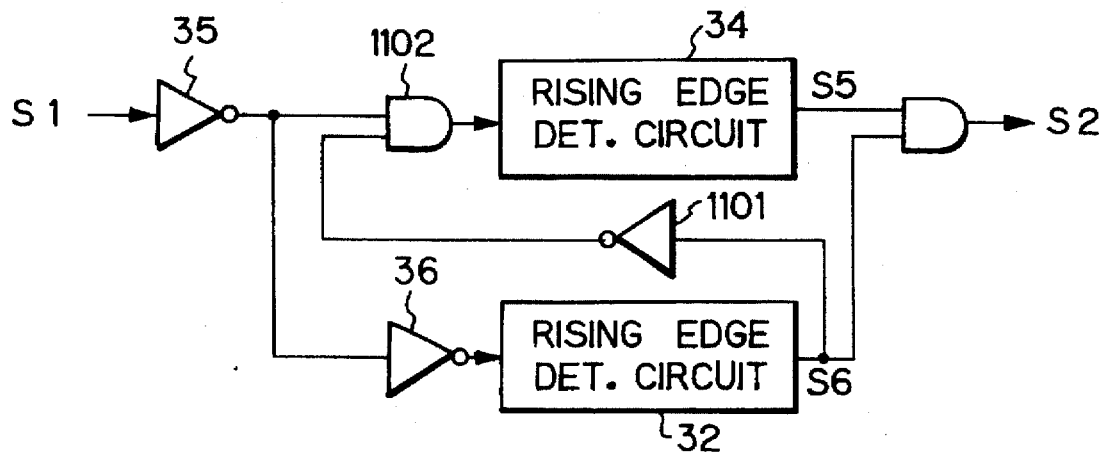
Figure 13:
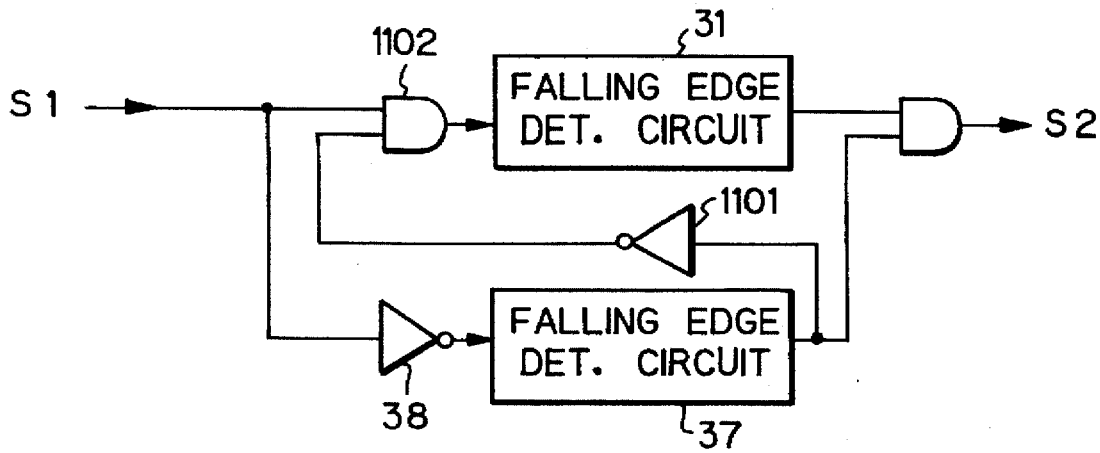

In FIGS. 11, 12 and 13, an inverter 1101 and an AND circuit 1102 are added to the elements of FIGS. 3, 4 and 5, respectively. In FIGS. 11, 12 and 13, after a rising edge is detected in the signal S1, a falling edge is detected in the signal S1. In more detail, in FIG. 11, when the rising edge detecting circuit 32 generates a low level pulse signal S6, the falling edge detecting circuit 31 can operate in response to the signal S1. In FIG. 12, when the rising edge detecting circuit 32 generates a low level pulse signal S6, the rising edge detecting circuit 34 can operate in response to the signal S1. In FIG. 13, when the falling edge detecting circuit 37 generates a low level pulse signal S6, the falling edge detecting circuit 31 can operate in response to the signal S1.

Since the operations of the apparatuses of FIGS. 11, 12 and 13 are similar to each other and to the operations as shown in FIGS. 10A through 10H, the description of these operations is omitted.

In FIG. 14, which is a detailed circuit diagram of the falling edge detecting circuit 31 (37) of FIGS. 3, 5, 7, 9, 11 and 13, a one-shot multivibrator 1401, a D-type flip-flop 1402 having a preset terminal PR and a one-shot mutivibrator 1403 are provided.

The one-shot multivibrator 1401 is operated in response to a falling edge of a signal S11 as shown in FIG. 15A, to generate a low level pulse signal S12 having the time period T1 as shown in FIG. 15B. Note that the time period T1 is shorter than a minimum time period of one bit (T0) of the signal S11 (the burst signal).

The D-type flip-flop 1402 is clocked by a rising edge of the output signal S12 of the one-shot multivibrator 1401 to take in the signal S11 from its data input. On the other hand, the data of the D-type flip-flop 1402 is preset by a rising edge of the signal S11. Therefore, the D-type flip-flop 1402 generates a signal S13 as shown in FIG. 15C.

Further, the one-shot multivibrator 1403 is operated in response to a falling edge of the output signal S13 of the D-type flip-flop 1402 to generate a low level pulse signal S14 having the pulse width T2. Note that the pulse width T2 is longer than a time period of a predetermined number of bits (T0) of the signal S11 (the burst signal) which are unchanged. For example, the predetermined number of bits is 8.

In FIG. 14, if noise having a time period shorter than the time period T1 is generated in the signal S11 as shown in FIG. 16A, the one-shot multivibrator 1401 is operated to generate the signal S12 as shown in FIG. 16B. Therefore, the output signal S13 of the D-type flip-flop 1402 is always high as shown in FIG. 16C, and accordingly, the output signal S14 of the one-shot multivibrator 1403 is always high as shown in FIG. 16D. Therefore, the falling edge detecting circuit of FIG. 14 is not subject to noise as shown in FIG. 16A.

In FIG. 17, which is a detailed circuit diagram of the rising edge detecting circuit 32 (34) of FIGS. 3, 4, 7, 8, 11 and 12, a one-shot multivibrator 1401', a D-type flip-flop 1402' having a clear terminal CL and a one-shot mutivibrator 1403' are provided.

The one-shot multivibrator 1401' is operated in response to a rising edge of a signal S11' as shown in FIG. 18A, to generate a low level pulse signal S12 having the time period T1 as shown in FIG. 18B.

The D-type flip-flop 1402' is clocked by a rising edge of the output signal S12' of the one-shot multivibrator 1401' to take in the signal S11' from its data input. On the other hand, the data of the D-type flip-flop 1402' is cleared by a rising edge of the signal S11'. Therefore, the D-type flip-flop 1402' generates a signal S13' as shown in FIG. 18C.

Further, the one-shot multivibrator 1403' is operated in response to a rising edge of the output signal S13 of the D-type flip-flop 1402' to generate a low level pulse signal S14' having the pulse width T2.

In FIG. 17, if noise having a time period shorter than the time period T1 is generated in the signal S11' as shown in FIG. 19A, the one-shot multivibrator 1401' is operated to generate the signal S12' as shown in FIG. 19B. Therefore, the output signal S13' of the D-type flip-flop 1402' is always low as shown in FIG. 19C, and accordingly, the output signal S14' of the one-shot multivibrator 1403' is always high as shown in FIG. 19D. Therefore, the rising edge detecting circuit of FIG. 17 is not subject to noise as shown in FIG. 19A.

As explained hereinbefore, according to the present invention, since a protection time is provided for detecting a falling edge or a rising edge in the burst signal, the apparatus is not subject to noise. Also, since the apparatus is operated in response to every bit of the burst signal, the apparatus can rapidly recover its receiving state even after the apparatus is erroneously operated by noise or the like. Further, since the burst signal detection signal depends upon each bit of the detected burst signal, the apparatus can be applied to random length burst signals.

I claim:

1. A burst signal detecting apparatus comprising:

a falling edge detecting means for detecting a falling edge in a burst signal to generate a first pulse signal when a low level of said burst signal continues for a first time period after said falling edge is detected in said burst signal;

a rising edge detecting means for detecting a rising edge in said burst signal to generate a second pulse signal when a high level of said burst signal continues for said first time period after said rising edge is detected in said burst signal;

a means for logically adding said first pulse signal to said second pulse signal, to generate a burst signal detection signal, said first time period being shorter than a minimum time period of one bit of said burst signal, a pulse width of each of said first pulse signal and said second pulse signal being longer than a time period of a predetermined number of bits of said burst signal.

2. The apparatus as set forth in claim 1, further comprising a means for enabling said rising edge detecting means only when said falling edge detecting means generates said first pulse signal.

3. The apparatus as set forth in claim 1, further comprising a means for enabling said falling edge detecting means only when said rising edge detecting means generates said second pulse signal.

4. A burst signal detecting apparatus comprising:

a falling edge detecting circuit for detecting a falling edge in a burst signal to generate a first pulse signal when a low level of said burst signal continues for a first time period after said falling edge is detected in said burst signal;

a rising edge detecting circuit for detecting a rising edge in said burst signal to generate a second pulse signal when a high level of said burst signal continues for said first time period after said rising edge is detected in said burst signal; and a logic gate circuit, connected to said falling edge detecting circuit and said rising edge detecting circuit, for logically adding said first pulse signal to said second pulse signal, to generate a burst signal detection signal, said first time period being smaller than a minimum time period of one bit of said burst signal, a pulse width of each of said first pulse signal and said second pulse signal being larger than a time period of a predetermined number of bits of said burst signal.

5. The apparatus as set forth in claim 4, wherein said first and second pulse signals are low level signals, said logic gate circuit comprising a first AND circuit.

6. The apparatus as set forth in claim 5, further comprising:

an inverter connected to an output of said falling edge detecting circuit; and a second AND circuit having an input connected to an output of said inverter, an input for receiving said burst signal, and an output connected to said rising edge detecting circuit.

7. The apparatus as set forth in claim 5, further comprising:

an inverter connected to an output of said rising edge detecting circuit; and a second AND circuit having an input connected to an output of said inverter, an input for receiving said burst signal, and an output connected to said falling edge detecting circuit.

8. The apparatus as set forth in claim 4, wherein said falling edge detecting circuit comprises:

a first one-shot multivibrator being operated in response to a falling edge of an input signal to generate a first low level pulse signal having said first time period;

a D-type flip-flop having a data terminal and a preset terminal for receiving said input signal of said first one-shot multivibrator and having a clock terminal connected to said first one-shot multivibrator, said D-type flip-flop being clocked by a rising edge of said first low level pulse signal of said first one-shot multivibrator to take in said input signal of said first one-shot multivibrator and being preset by a rising edge of said input signal of said first one-shot multivibrator; and a second one-shot multivibrator connected to said D-type flip-flop, said second one-shot multivibrator being operated in response to a rising edge of an output signal of said D-type flip-flop to generate a second low level pulse signal having a second time period.

9. The apparatus as set forth in claim 4, wherein said rising edge detecting circuit comprises:

a first one-shot multivibrator being operated in response to a rising edge of an input signal thereof to generate a first low level pulse signal having said first time period;

a D-type flip-flop having a data terminal and a clear terminal for receiving said input signal of said first one-shot multivibrator and having a clock terminal connected to said first one-shot multivibrator said D-type flip-flop being clocked by a rising edge of said first low level pulse signal of said first one-shot multivibrator to take in said input signal of said first one-shot multivibrator and being cleared by a falling edge of said input signal of said first one-shot multivibrator; and a second one-shot multivibrator connected to said D-type flip-flop, said second one-shot multivibrator being operated in response to a falling edge of an output signal of said D-type flip-flop, to generate a second low level signal having a second time period.

10. A burst signal detecting apparatus comprising:

a first inverter for receiving a burst signal;

a second inverter connected to said first inverter;

a first rising edge detecting circuit, connected to said first inverter, for detecting a first rising edge in an output signal of said first inverter to generate a first pulse signal when a high level of said burst signal continues for a first time period after said first rising edge is detected in the output signal of said first inverter, a second rising edge detecting circuit, connected to said second inverter, for detecting a second rising edge in an output signal of said second inverter to generate a second pulse signal when a high level of said burst signal continues for said first time period after said second rising edge is detected in the output signal of said second inverter; and a logic gate circuit, connected to said first rising edge detecting circuit and said second rising edge detecting circuit, for logically adding said first pulse signal to said second pulse signal, to generate a burst signal detection signal, said first time period being smaller than a minimum time period of one bit of said burst signal, a pulse width of each of said first pulse signal and said second pulse signal being larger than a time period of a predetermined number of bits of said burst signal.

11. The apparatus as set forth in claim 10, wherein said first and second pulse signals are low level signals, said logic gate circuit comprising a first AND circuit.

12. The apparatus as set forth in claim 11, further comprising:

a third inverter connected to an output of said second rising edge detecting circuit; and a second AND circuit having an input connected to an output of said first inverter, an input connected to said third inverter, and an output connected to said first rising edge detecting circuit.

13. The apparatus as set forth in claim 10, wherein each of said first and second rising edge detecting circuits comprises:

a first one-shot multivibrator being operated in response to a rising edge of an input signal thereof to generate a first low level pulse signal having said first time period;

a D-type flip-flop having a data terminal and a clear terminal for receiving said input signal of said first one-shot multivibrator and having a clock terminal connected to said first one-shot multivibrator, said D-type flip-flop being clocked by a rising edge of said first low level pulse signal of said first one-shot multivibrator to take in said input signal of said first one-shot multivibrator and being cleared by a falling edge of said input signal of said first one-shot multivibrator; and a second one-shot multivibrator connected to said D-type flip-flop, said second one-shot multivibrator being operated in response to a falling edge of an output signal of said D-type flip-flop, to generate a second low level signal having a second time period.

14. A burst signal detecting apparatus comprising:

a first inverter for receiving a burst signal;

a first rising edge detecting circuit, connected to said first inverter, for detecting a first rising edge in an output signal of said first inverter to generate a first pulse signal when a first time period passes after said first rising edge is detected in the output signal of said first inverter;

a second inverter connected to said first rising edge detecting circuit;

a NAND circuit having an input connected to said second inverter, an input connected to said first inverter, and an output;

a second rising edge detecting circuit, connected to the output of said NAND circuit for detecting a second rising edge in an output signal of said NAND circuit to generate a second pulse signal when said first time period passes after said second rising edge is detected in the output signal of said NAND circuit; and a logic gate circuit, connected to said first rising edge detecting circuit and a second rising edge detecting circuit, for logically adding said first pulse signal to said second pulse signal, to generate a burst signal detection signal, said first time period being smaller than a minimum time period of one bit of said burst signal, a pulse width of each of said first pulse signal and said second pulse signal being larger than a time period of a predetermined number of bits of said burst signal.

15. The apparatus as set forth in claim 14, wherein said first and second pulse signals has low level signals, said logic gate circuit comprising an AND circuit.

16. The apparatus as set forth in claim 14, wherein each of said first and second rising edge detecting circuits comprises:

a first one-shot multivibrator being operated in response to a rising edge of an input signal thereof to generate a first low level pulse signal having said first time period;

a D-type flip-flop having a data terminal and a clear terminal for receiving said input signal of said first one-shot multivibrator and having a clock terminal connected to said first one-shot multivibrator, said D-type flip-flop being clocked by a rising edge of said first low level pulse signal of said first one-shot multivibrator to take in said input signal of said first one-shot multivibrator and being cleared by a falling edge of said input signal of said first one-shot multivibrator; and a second one-shot multivibrator connected to said D-type flip-flop, said second one-shot multivibrator being operated in response to a falling edge of an output signal of said D-type flip-flop, to generate a second low level signal having a second time period.

17. A burst signal detecting apparatus comprising:

a first inverter for receiving a burst signal;

a first falling edge detecting circuit for detecting a first falling edge in said burst signal to generate a first pulse signal when a low level of said burst signal continues for a first time period after said first falling edge is detected in said burst signal;

a second falling edge detecting circuit, connected to said first inverter, for detecting a second falling edge in an output signal of said second inverter to generate a second pulse signal when a high level of said burst signal continues for said first time period after second falling edge is detected in the output signal of said first inverter; and a logic gate circuit, connected to said first falling edge detecting circuit and said second falling edge detecting circuit, for logically adding said first pulse signal to said second pulse signal, to generate a burst signal detection signal, said first time period being smaller than a minimum time period of one bit of said burst signal, each of a pulse width of said first pulse signal and a pulse width of said second pulse signal being larger than a time period of a predetermined number of bits of said burst signal.

18. The apparatus as set forth in claim 17, wherein said first and second pulse signals are low level signals, said logic gate circuit comprising a first AND circuit.

19. The apparatus as set forth in claim 18, further comprising:

a second inverter connected to an output of said second falling edge detecting circuit; and a second AND circuit having an input connected to an output of said second inverter, an input for receiving said burst signal, and an output connected to said first falling edge detecting circuit.

20. The apparatus as set forth in claim 17, wherein each of said first and second rising edge detecting circuits comprises:

a first one-shot multivibrator being operated in response to a falling edge of an input signal thereof to generate a first low level pulse signal having said first time period;

a D-type flip-flop having a data terminal and a preset terminal for receiving said input signal of said first one-shot multivibrator and having a clock terminal connected to said first one-shot multivibrator, said D-type flip-flop being clocked by a rising edge of said first low level pulse signal of said first one-shot multivibrator to take in said input signal of said first one-shot multivibrator and being preset by a rising edge of said input signal of said first one-shot multivibrator; and a second one-shot multivibrator connected to said D-type flip-flop, said second one-shot multivibrator being operated in response to a falling edge of an output signal of said D-type flip-flop, to generate a second low level signal having a second time period.

21. A burst signal detecting apparatus comprising:

a first falling edge detecting circuit for detecting a first falling edge in said burst signal to generate a first pulse signal when a first time period passes after said first falling edge is detected in said burst sisgnal;

a first inverter connected to said first falling edge detecting circuit;

a NAND circuit having an input connected to said first inverter, an input for receiving said burst signal, and an output;

a second falling edge detecting circuit, connected to the output of said NAND circuit for detecting a second falling edge in an output signal of said NAND circuit to generate said first pulse signal when a second time period passes after said second falling edge is detected in the output signal of said NAND circuit; and a logic gate circuit, connected to said first falling edge detecting circuit and said second falling edge detecting circuit, for logically adding said first pulse signal to said second pulse signal, to generate a burst signal detection signal, said first time period being smaller than a minimum time period of one bit of said burst signal, a pulse width of each of said first pulse signal and said second pulse signal being larger than a time period of a predetermined number of bits of said burst signal.

22. The apparatus as set forth in claim 21, wherein said first and second pulse signals has low level signals, said logic gate circuit comprising a AND circuit.

23. The apparatus as set forth in claim 21, wherein each of said first and second falling edge detecting circuits comprises:

- a first one-shot multivibrator being operated in response to a falling edge of an input signal to generate a first low level pulse signal having said first time period;
- a D-type flip-flop having a data terminal and a preset terminal for receiving said input signal of said first one-shot multivibrator and having a clock terminal connected to said first one-shot multivibrator, said D-type flip-flop being clocked by a rising edge of said first low level pulse signal of said first one-shot multivibrator to take in said input signal of said first one-shot multivibrator and being preset by a rising edge of said input signal of said first one-shot multivibrator; and
- a second one-shot multivibrator connected to said D-type flip-flop, said second one-shot multivibrator being operated in response to a rising edge of an output signal of said D-type flip-flop to generate a second low level pulse signal having a second time period.

\* \* \* \* \*